(12) United States Patent
Kim

(10) Patent No.: US 7,119,594 B2
(45) Date of Patent: Oct. 10, 2006

(54) DUTY CYCLE CORRECTION CIRCUIT OF DELAY LOCKED LOOP AND DELAY LOCKED LOOP HAVING THE DUTY CYCLE CORRECTION CIRCUIT

(75) Inventor: Chan-kyung Kim, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 83 days.

(21) Appl. No.: 10/798,484

(22) Filed: Mar. 12, 2004

(65) Prior Publication Data

US 2004/0178835 A1 Sep. 16, 2004

(30) Foreign Application Priority Data

Mar. 13, 2003 (KR) ................. 10-2003-0015863

(51) Int. Cl.
H03K 3/017 (2006.01)
(52) U.S. Cl. ..................... 327/175; 327/172
(58) Field of Classification Search .............. None
See application file for complete search history.

(56) References Cited

U.S. PATENT DOCUMENTS

| 5,945,862 | A  | * | 8/1999 | Donnelly et al. | 327/278 |
| 6,181,178 | B1 | * | 1/2001 | Choi | 327/175 |
| 6,342,801 | B1 | * | 1/2002 | Shin | 327/175 |
| 6,643,790 | B1 | * | 11/2003 | Yu et al. | 713/500 |
| 6,735,669 | B1 | * | 5/2004 | Shin | 711/106 |
| 6,853,225 | B1 | * | 2/2005 | Lee | 327/158 |

* cited by examiner

*Primary Examiner*—Timothy P. Callahan
*Assistant Examiner*—Cassandra Cox
(74) *Attorney, Agent, or Firm*—Volentine Francos & Whitt

(57) ABSTRACT

A duty cycle correction circuit and a delay locked loop (DLL) including the duty cycle correction circuit, are capable of controlling their operation in order to correctly analyze the cause of generation of a duty cycle error when the duty cycle error is generated in the DLL. The duty cycle correction circuit selectively outputs to a DLL core duty cycle offset information for controlling a duty cycle of an internal clock signal synchronized to an external clock signal under the control of a switching control signal. The DLL corrects the duty cycle of a reference clock signal according to the duty cycle offset information, thereby outputting a reference clock signal having a 50% duty cycle.

7 Claims, 4 Drawing Sheets

DUTY CYCLE CORRECTION CIRCUIT OF DELAY LOCKED LOOP AND DELAY LOCKED LOOP HAVING THE DUTY CYCLE CORRECTION CIRCUIT

CROSS REFERENCES TO RELATED APPLICATIONS

This application claims priority under 35 U.S.C. § 119 from Korean Patent Application No. 2003-15863, filed on 13 Mar. 2003, the entirety of which is hereby incorporated by reference for all purposes as if fully set forth herein.

BACKGROUND AND SUMMARY

1. Technical Field

The present invention relates to a duty cycle correction circuit of a delay locked loop (DLL) and a delay locked loop including the duty cycle correction circuit, and more particularly to a duty cycle correction circuit including a switching circuit and a delay locked loop (DLL) including the duty cycle correction circuit, for efficiently analyzing the cause of generation of a duty cycle error.

2. Description

Generally, a Delay Locked Loop (DLL) receives an external clock signal input from the outside of a system and generates an internal clock signal synchronized to the external clock signal. The system includes logic devices, semiconductor devices, etc., using the internal clock signal.

The DLL can be utilized in a cache memory device (instead of an SRAM device that is generally used) for increasing a data processing rate between a CPU and DRAM, or applied to a synchronous DRAM, a RAMBUS DRAM®, etc., as well as various types of logic devices.

The Double Data rate (DDR) technique has been developed for improving the bandwidth of a memory system. A DDR memory system uses the rising edge and falling edge of the internal clock signal. The duty cycle of the internal clock signal is an important factor for maintaining the maximum timing margin in a high performance memory system.

When the duty cycle of the internal clock signal is not maintained at exactly 50%, the deviation of the duty cycle from 50% reduces the timing margin of a high performance memory system. For this reason, an apparatus for compensating for distortion of the duty cycle due to changes of processes, voltages, and temperatures, is necessary. A duty cycle correction circuit utilized in a DLL is a circuit for correcting the duty cycle of the internal clock signal.

FIG. 1 is a block diagram of a conventional delay locked loop (DLL). Referring to FIG. 1, the DLL 100 includes a DLL core 110, a clock buffer 130, and a duty cycle correction circuit 150.

The DLL core 110, an essential part of the DLL, receives an external clock signal ECLK and generates an internal clock signal ICLK synchronized to the external clock signal ECLK.

The clock buffer 130 includes a plurality of serially interconnected inverters 131, 133, 135, ..., 137, and buffers the internal clock signal ICLK to generate a reference clock signal CLK and a complementary reference clock signal CLKB.

The inverter 131 includes one PMOS transistor P1 and one NMOS transistor N1, which are serially connected between a source voltage VDD and a ground voltage VSS. The structures of the remaining inverters 133, 135, ..., 137 are the same as that of the inverter 131. The process for generating the reference clock signal CLK and the complementary reference clock signal CLKB is well known in the art.

When the channel length to channel width ratio of the PMOS transistor P1 and NMOS transistor N1 is the same in each of the inverters 131, 133, 135, ..., 137, then the clock buffer 130 can output differential reference clock signals CLK and CLKB having a duty cycle of 50%.

However, if the duty cycle of the differential reference clock signals CLK and CLKB becomes 45% or 55% (hereinafter, referred to as "case when a duty cycle error is generated"), or not exactly 50%, due to changes in a process, voltage, and temperature, then the timing margin of the high performance memory system is reduced.

To avoid this problem, the duty cycle correction circuit 150 converts the differential reference clock signals CLK and CLKB into duty cycle offset information DCC and DCCB, and feeds back the duty cycle offset information DCC and DCCB to the DLL core 110. Thus, the DLL core 110 controls the duty cycle of the internal clock signal ICLK to be exactly 50% in response to the duty cycle offset information DCC and DCCB.

Since the duty cycle correction circuit 150 always operates while the DLL 100 is operating, it is not known whether the differential reference clock signals CLK and CLKB having the 50% duty cycle are generated by the interaction of the clock buffer 130 and the duty cycle correction circuit 150, or by the greater operation of the clock buffer 130 rather than that of the duty cycle correction circuit 150.

Thus, when a duty cycle error is generated, it is impossible to correctly analyze whether the duty cycle error is generated by the clock buffer 130 or by the duty cycle correction circuit 150.

Therefore, it would be desirable to provide a duty cycle correction circuit and a delay locked loop (DLL) including the duty cycle correction circuit, where the DLL is capable of controlling its operation in order to correctly analyze the cause of a duty cycle error when a duty cycle error is generated in the DLL.

According to one aspect of the present invention, a duty cycle correction circuit of a delay locked loop comprises: a differential amplifier which receives and amplifies differential reference signals input from a first input terminal and a second input terminal, and outputs differential output signals to a first differential output terminal and a second differential output terminal; a first transmission circuit which is connected between the first differential output terminal and a first node, and transmits a signal of the first differential output terminal to the first node under the control of control signals; a second transmission circuit which is connected between the second differential output terminal and a second node, and transmits a signal of the second differential output terminal to the second node under the control of the control signals; a first storage unit which is connected between the first node and a ground voltage and stores a signal of the first node; a second storage unit which is connected between the second node and the ground voltage and stores a signal of the second node; and a switching circuit which connects the first node to a first output terminal and the second node to a second output terminal under the control of a switching control signal.

The switching circuit comprises: a third transmission circuit which transmits the signal of the first node to the first output terminal when a switching control signal has a deactivated state; a fourth transmission circuit which transmits the signal of the second node to the second output terminal when the switching control signal has the deactivated state; a first voltage supplying circuit which is connected between the first output terminal and the ground voltage, and supplies the ground voltage to the first output terminal when a switching control signal has an activated state; and a second voltage supplying circuit which is connected between the second output terminal and the ground voltage, and supplies the ground voltage to the second output terminal when the switching control signal has the activated state.

The first transmission circuit through the fourth transmission circuit each include a PMOS transistor and a NMOS transistor. The first storage unit and the second storage unit each include a MOS transistor.

According to another aspect of the present invention, a delay locked loop comprises: a DLL core which receives an external clock signal and generates an internal clock signal synchronized to the external clock signal; a buffer which buffers the internal clock signal and outputs differential reference clock signals; and a duty cycle correction circuit which generates first control signals having desired offsets corresponding to differences in the duty cycles of each of the differential reference clock signals, and outputs the first control signals to the DLL core under the control of a switching control signal, wherein the DLL core corrects a duty cycle of the internal clock signal under the control of the first control signals.

The delay locked loop further comprises a pad for receiving the switching control signal. The delay locked loop further comprises a mode register set for generating the switching control signal.

According to another yet aspect of the present invention, a duty cycle correction circuit, comprises: input terminal adapted to receive a pair of differential reference clock signals each having a duty cycle; integrating means for integrating each of the reference clock signals to produce a pair of control signals indicating the duty cycles of the differential reference clock signals; and switching means adapted to receive a switching control signal and in response thereto to selectively output the control signals when the switching control signal has a first state and to output a pair of fixed voltage signals when the switching control signal has a second state.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Hereinafter, embodiments of the present invention will be described in detail with reference to the appended drawings. In respective drawings, components denoted by a same reference number represent a same component.

Figure 1:
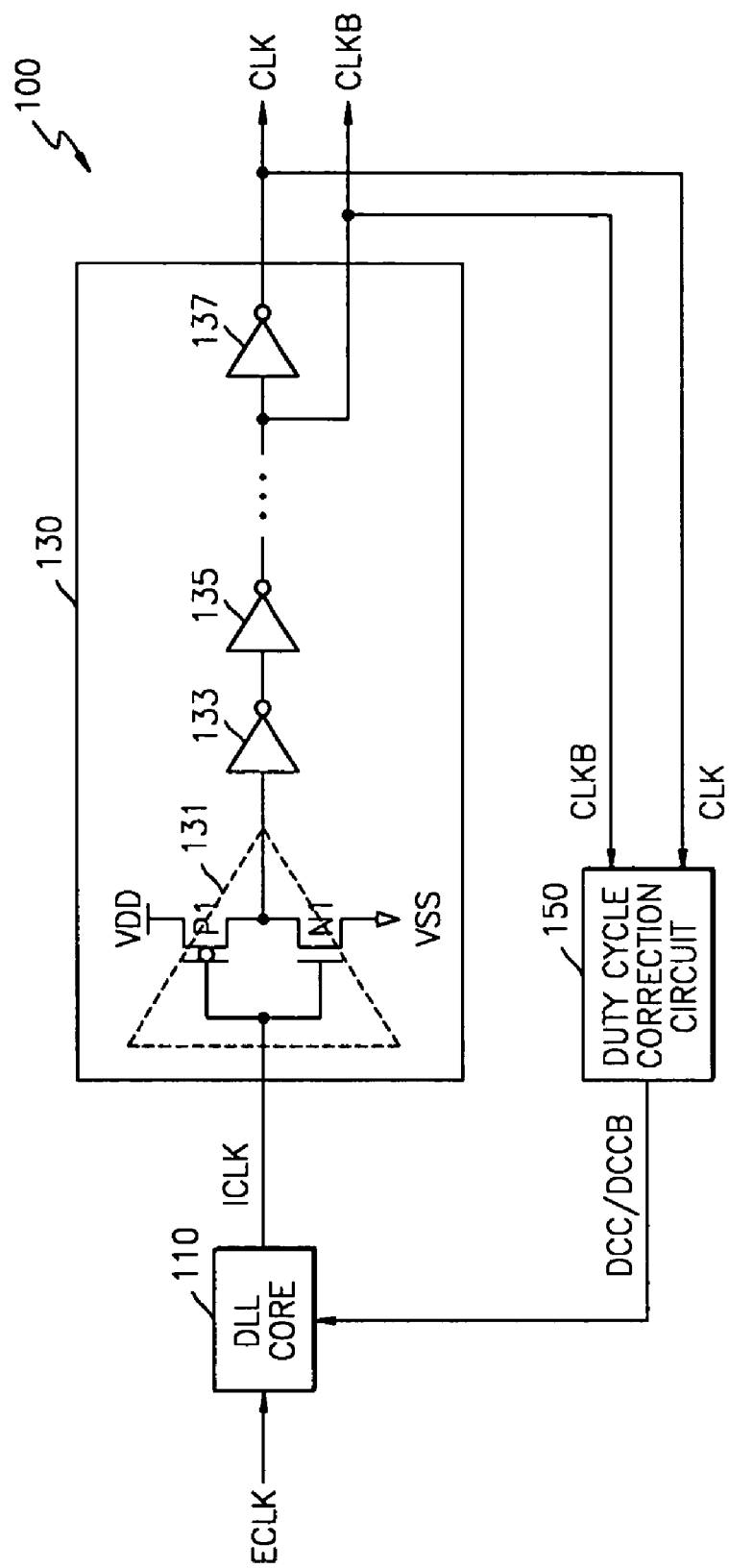
FIG. 1 is a block diagram of a conventional delay locked loop.
Figure 2:
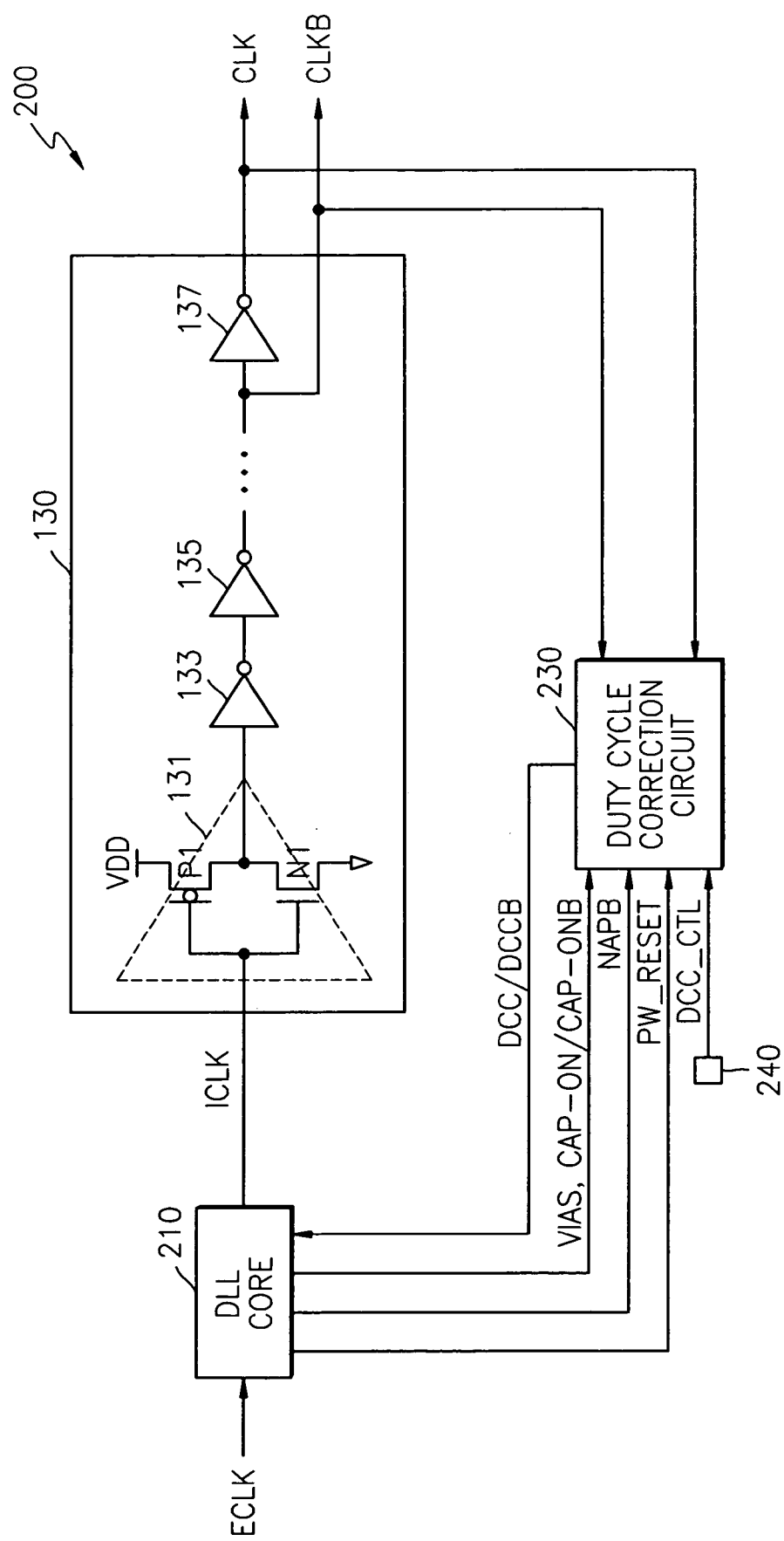
FIG. 2 is a block diagram of a delay locked loop according to a preferred embodiment.

FIG. 2 is a block diagram of a delay locked loop according to a preferred embodiment. Referring to FIG. 2, the delay locked loop (also, referred to as DLL) 200 includes a DLL core 210, a clock buffer 130, a duty cycle correction circuit 230, and a pad 240.

The DLL core 210 receives an external clock signal ECLK and generates an internal clock signal ICLK synchronized to the external clock signal ECLK. The clock buffer 130 buffers the internal clock signal ICLK and generates differential reference clock signals CLK and CLKB.

The duty cycle correction circuit 230 generates first control signals DCC and DCCB having desired offsets corresponding to differences between respective duty cycles of the differential reference clock signals CLK and CLKB, and outputs the first control signals DCC and DCCB to the DLL core 210. The generation and subsequent output of the control signals DCC and DCCB is performed under the control of a switching control signal DCC_CTL input from outside of the DLL 200 through the pad 240.

The DLL core 210 corrects the duty cycle of the internal clock signal ICLK under the control of the first control signals DCC and DCCB. The first control signals DCC and DCCB include duty cycle offset information.

The switching control signal DCC_CTL can be generated by a mode register set (MRS) or logic register.

Figure 3:
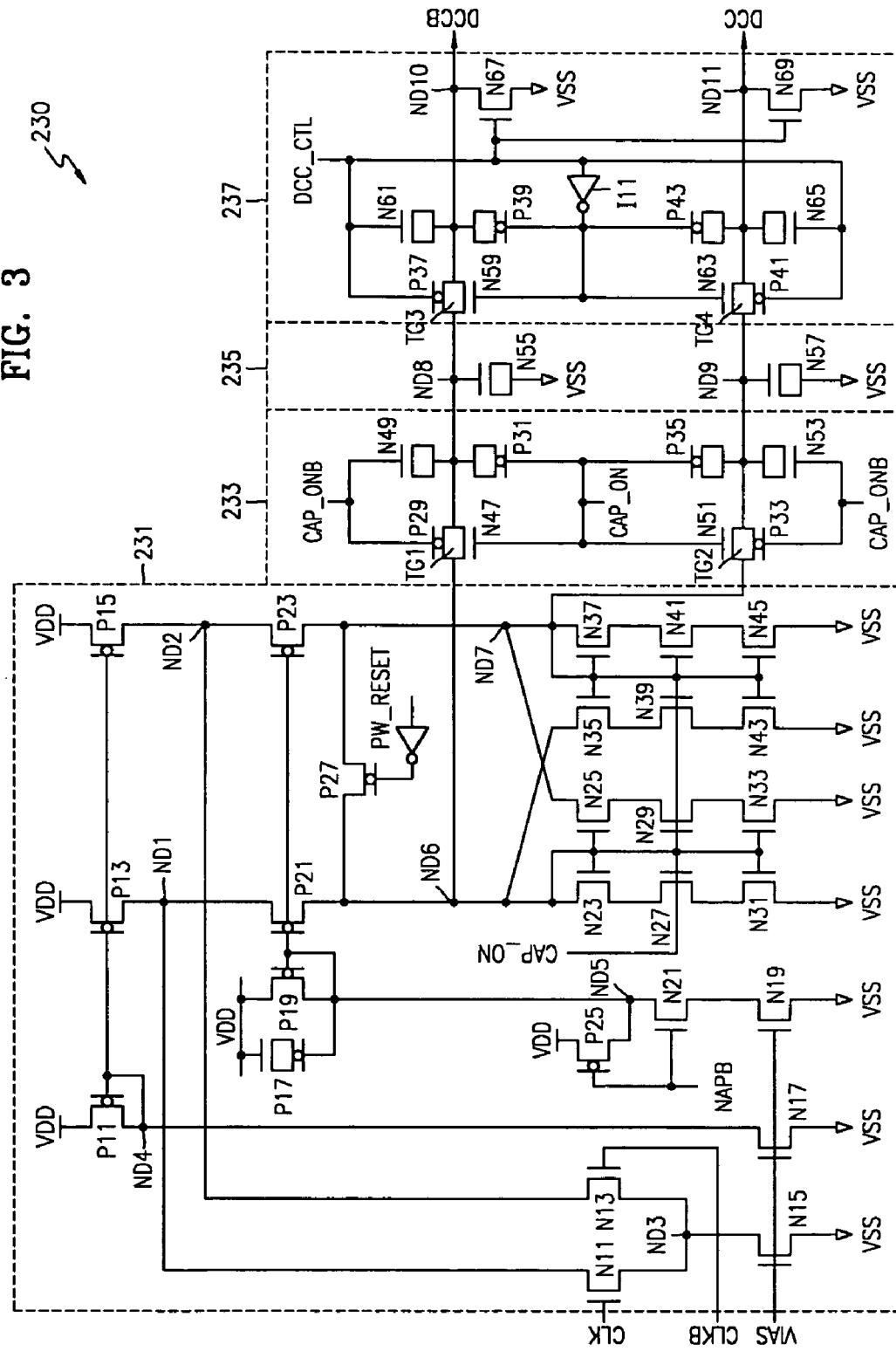
FIG. 3 is a circuit diagram of a duty cycle correction circuit of a delay locked loop, according to a preferred embodiment.

FIG. 3 is a circuit diagram of the duty cycle correction circuit of the delay locked loop, according to a preferred embodiment. Referring to FIG. 3, the duty cycle correction circuit 230 includes a differential amplifier 231, a transmission circuit 233, a storage unit 235, and a switching circuit 237.

The differential amplifier 231 receives a reference clock signal CLK input via the gate (hereinafter, referred to as "a first input terminal") of an NMOS transistor N11 and a complementary reference clock signal CLKB input via the gate (hereinafter, referred to as "a second input terminal") of an NMOS transistor N13, amplifies the difference between both reference clock signals CLK and CLKB, and outputs the amplified differential output signals to a first differential output node ND6 and a second differential output node ND7, respectively.

The transmission circuit 233 includes a first transmission circuit TG1 and a second transmission circuit TG2. The first transmission circuit TG1 is comprised of a PMOS transistor P29 and an NMOS transistor N47. The second transmission circuit TG2 is comprised of a PMOS transistor P33 and a NMOS transistor N51.

The first transmission circuit TG1 is connected between the first differential output terminal ND6 and a first node ND8, and transmits a signal of the first differential output terminal ND6 to the first node ND8 under the control of control signals CAP_ON and CAP_ONB.

The second transmission circuit TG2 is connected between the second differential output terminal ND7 and a second node ND9, and transmits a signal of the second differential output terminal ND7 to the second node ND9 under the control of the control signals CAP_ON and CAP_ONB. The control signals CAP-ON and CAP-ONB are complementary signals.

The storage unit 235 includes a first storage unit N55 and a second storage unit N57. The first storage unit N55 is connected between the first node ND8 and a ground voltage VSS and stores the signal of the first node ND8. The first storage unit N55 is comprised of an NMOS transistor.

The second storage unit N57 is connected between the second node ND9 and the ground voltage VSS and stores the signal of the second node ND9. The second storage unit N57 is also comprised of an NMOS transistor.

The switching circuit 237 connects the first node ND8 to a first output node ND10, and the second node ND9 to a second output node ND11, respectively, under the control of a switching control signal DCC_CTL. The switching circuit 237 includes a third transmission circuit TG3, a fourth transmission circuit TG4, a first voltage supplying circuit N67, and a second voltage supplying circuit N69.

The third transmission circuit TG3 is comprised of a PMOS transistor P37 and an NMOS transistor N59, and transmits the signal of the first node ND8 to the first output terminal ND10 when the switching control signal DCC_CTL is in a deactivated state (logic "low").

The fourth transmission circuit TG4 is comprised of a PMOS transistor P41 and a NMOS transistor N63, and transmits the signal of the second node ND9 to the second output terminal ND11 when the switching control signal DCC_CTL is in the deactivated state (logic "low").

The first voltage supplying circuit N67 is connected between the first output terminal ND10 and the ground voltage VSS, and supplies the ground voltage VSS to the first output terminal ND10 when the switching control signal DCC_CTL is activated (logic "high"). When the first voltage supplying circuit N67 is implemented by an NMOS transistor, then the first output terminal ND10 is pulled down to the ground voltage VSS when the switching control signal DCC_CTL is activated.

The second voltage supplying circuit N69 is connected between the second output terminal ND11 and the ground voltage VSS, and supplies the ground voltage VSS to the second output terminal ND11, when the switching control signal DCC_CTL is in the activated. When the second voltage supplying circuit N69 is implemented by a NMOS transistor, then the second output terminal ND11 is pulled down to the ground voltage VSS when the switching control signal DCC_CTL is activated.

The operation of the duty cycle correction circuit 230 of the delay locked loop will now be described with reference to FIGS. 2 and 3. First, the detailed operation of the differential amplifier 231 is described as follows.

If a bias voltage VIAS output from the DLL core 211 is activated to a "high" level, NMOS transistors N15, N17, and N19 and PMOS transistors P11, P13, and P15, each of which acts as a current source, are turned-on, and accordingly the differential amplifier 231 is operated.

If a mode control signal NAPB is also activated to a "high" level, then the NMOS transistor N21 is turned-on, and the voltage of the node ND5 is pulled down to the ground voltage VSS via the turned-on NMOS transistors N21 and N19. Since the voltage of the node ND5 is pulled down to the ground voltage VSS, a PMOS type capacitor P17 and PMOS transistors P19, P21, and P23 each having a current mirror structure, are turned-on.

Also, the voltages of nodes ND1 and ND2 are differentially amplified by the NMOS transistors N11 and N13, respectively, which are turned-on or turned-off according to the states of the differential reference clock signals CLK and CLKB. The amplified signals of the nodes ND1 and ND2 are transferred to the first differential output terminal ND6 and second differential output terminal ND7 via the turned-on PMOS transistors P21 and P23, respectively.

Any output terminal being in a "high" level among the differential output terminals ND6 and ND7 is changed to a "low" level since a current path to the ground voltage VSS is formed through NMOS transistors N27, N29, N39, and N41 when they are turned on by the activation of the control signal CAP_ON.

Also, any output terminal being in a "low" level among the differential output terminals ND6 and ND7 is pulled up to a "high" level by a source voltage VDD supplied through the PMOS transistors P13, P15, P21, and P23 having a current mirror structure, since the current path to the ground voltage VSS is not formed.

Accordingly, when the bias voltage VIAS has a "high" level, the mode control signal NAPB has a "high" level, and a power reset signal PW_RESET has a "low" level, then a differential signal corresponding to the differential reference clock signals CLK and CLKB is output to the differential output terminals ND6 and ND7, respectively.

Meanwhile, in the case where the bias voltage VIAS has a "high" level, both the mode control signal NAPB and the control signal CAP_ON have "low" levels, and the power reset signal PW_RESET has a "high" level, the NMOS transistor N21 is turned-off, the PMOS transistor P25 is turned-on, and accordingly, the voltage of the node ND5 becomes a "high" level. Therefore, the PMOS type capacitor P17 and the PMOS transistors P11, P13, and P15 having the current mirror structure are turned-off, respectively.

When the respective NMOS transistors N27, N29, N39, and N41 are turned-off, the differential amplifier 231 does not operate. At this time, the differential output terminals ND6 and ND7 are equalized by the PMOS transistor P27.

The control signal CAP_ON is input into the gates of the NMOS transistors N47 and N51 and the gates of the PMOS transistors P31 and P35. The complementary control signal CAP_ONB is input into the gates of the NMOS transistors N49 and N53 and the gates of the PMOS transistors P29 and P33. The NMOS transistor N49 and PMOS transistor P31, and the NMOS transistor N53 and PMOS transistor P35 form capacitors.

The first transmission circuit TG1 transmits the signal of the first differential output terminal ND6 to the first node ND8 under the control of the control signals CAP_ON and CAP_ONB. The second transmission circuit TG2 transmits the signal of the second differential output terminal ND7 to the second node ND9 under the control of the control signals CAP_ON and CAP_ONB.

The first storage unit N55 stores the signal (voltage) of the first node ND8 during a predetermined time period, and the second storage unit N57 stores the signal (voltage) of the second node ND9 during a predetermined time period.

The signal transmitted to the first node ND8 is transferred to the first output terminal ND10 when the switching control signal DCC_CTL has a "low" level, and also the signal transmitted to the second node ND9 is transferred to the second output terminal ND11 when the switching control signal DCC_CTL have the "low" level.

However, when the switching control signal DCC_CTL has a "high" level, then the third transmission circuit TG3 is turned-off, the fist output terminal ND10 is pulled down to the ground voltage VSS, the fourth transmission circuit TG4 is turned off, and the second output terminal ND11 is pulled down to the ground voltage VSS.

The switching control signal DCC_CTL is input into the gates of the respective PMOS transistors P37 and P41, the gates of the respective NMOS transistors N61, N65, N67, and N69, and an inverter 111. The output signal of the inverter 11 is input into the gates of the PMOS transistors P39 and P43 and the gates of the NMOS transistors N59 and N63. The NMOS transistor N61 and PMOS transistor P39, and the NMOS transistor N65 and PMOS transistor P43 form capacitors, respectively.

The duty cycle correction circuit 230 is turned on or turned off depending on the status of the switching control signal DCC_CTL.

Figure 4:
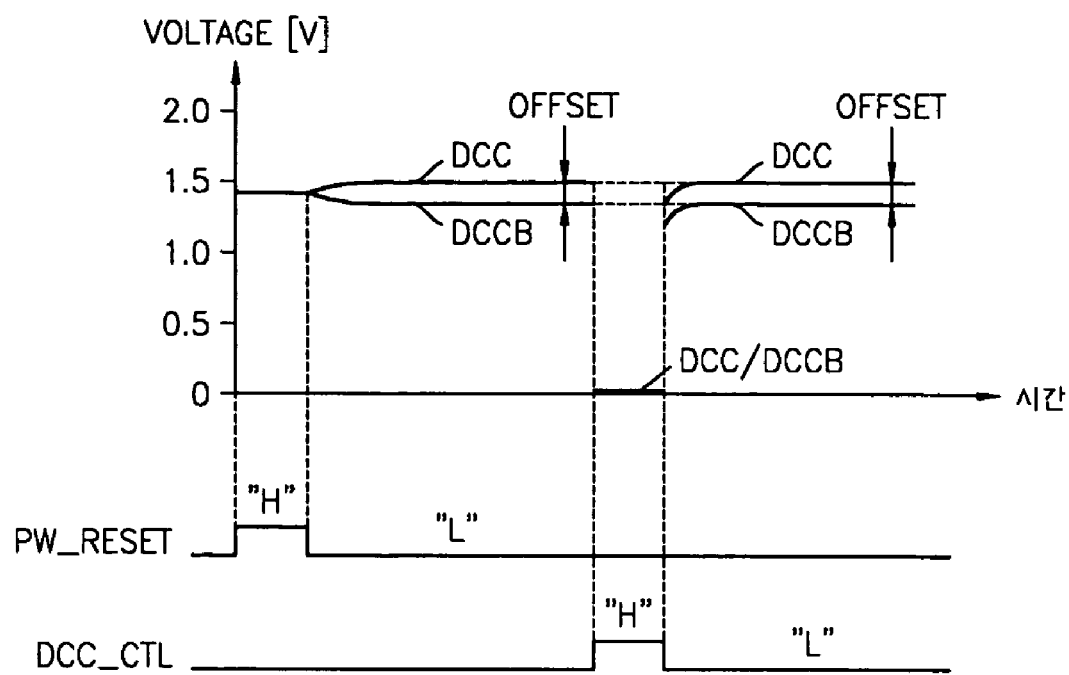
FIG. 4 is an operation timing chart of the duty cycle correction circuit of the delay locked loop.

FIG. 4 is an operation timing chart of the duty cycle correction circuit of the delay locked loop of FIGS. 2 and 3. The bias voltage VIAS, the mode control signal NAPB, and the control signal CAP_ON all have "high" levels ("H"), and the switching control signal DCC_CTL has a "low" level ("L").

A case where the duty cycle of the reference clock signal CLK is 50% is described below with reference to FIGS. 2 through 4.

The differential amplifier 231 receives and amplifies the reference clock signal CLK input from the first input terminal and the complementary reference clock signal CLKB input from the second input terminal, and outputs the amplified result into the first differential output terminal ND6 and the second differential output terminal ND7, respectively.

The first storage unit N55 stores electric charge corresponding to the duty cycle (for example, 45%) of the complementary reference clock signal CLKB, and the second storage unit N57 stores electric charge corresponding to the duty cycle (for example, 55%) of the reference clock signal CLK.

Therefore, a predetermined DC offset is generated between a signal DCCB that is output to the DLL core 210 via the first output terminal ND10, and a signal DCC that is output to the DLL core 210 via the second output terminal ND11.

The DLL core 210 corrects the duty cycle of the internal clock signal ICLK in response to the signals DCC and DCCB output from the duty cycle correction circuit 230. Accordingly, due to repeated interaction between the duty cycle correction circuit 230 and the DLL core 210, the duty cycle of the reference clock signal CLK becomes 50%. If the duty cycle of the reference clock signal CLK is 50%, then the DC offset is zero. Otherwise, if the duty cycle of the reference clock signal CLK becomes more or less than 50%, then the DC offset increases.

However, if the switching control signal DCC_CTL is changed to a "high" level ("H"), then the signal of the first node ND8 is not transmitted to the first output terminal ND10, and also the signal of the second node ND9 is not transmitted to the second output terminal ND11. Also, since the NMOS transistors N67 and N69 of the switching circuit 237 are turned-on when the switching control signal DCC_CTL has the high level, the output signal DCCB of the first output terminal ND10 and the output signal DCC of the second output terminal ND11 are pulled down to the ground voltage VSS. In this case, the electric charge stored in the first storage unit N55 and second storage unit N57 is maintained.

Accordingly, when the switching control signal DCC_CTL is changed to a high level ("H"), then the duty cycle of the reference clock signal CLK is determined depending on the inverters 131, 133, 135, . . . , 137 constituting the clock buffer 130.

If the switching control signal DCC_CTL is changed into a low level ("L"), then the signal of the first node ND8 is transmitted to the first output terminal ND10 and the signal of the second node ND9 is transmitted to the second output terminal ND11, and the NMOS transistors N67 and N69 are turned-off.

Accordingly, the switching circuit 237 outputs to the DLL core 210 the signals DCC and DCCB just before the switching control signal DCC_CTL is changed to the high level ("H"). Thus, the DLL core 210 corrects the duty cycle of the internal clock signal ICLK in response to the signals DCC and DCCB output from the duty cycle correction circuit 230.

Therefore, when a duty cycle error is generated in the DLL 200 including the duty cycle correction circuit 230, the duty cycle of the reference clock signal CLK becomes exactly 50%, regardless of whether a duty cycle error is generated by the clock buffer 130, due to the duty cycle correction circuit 230, and/or due to the clock buffer 130 and duty cycle correction circuit 230.

As described above, according to the present invention, it is possible to correctly analyze the cause of generation of the duty cycle error when the duty cycle error is generated in a DLL including the duty cycle correction circuit capable of being turned on or turned off. Therefore, in the DLL and the system including the DLL, debugging time can be minimized.

Also, it is possible to check whether the duty cycle correction circuit is operating correctly in a DLL including the duty cycle correction circuit according to the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A duty cycle correction circuit of a delay locked loop, comprising:

a differential amplifier having first and second input terminals and first and second differential output terminals, and adapted to receive differential reference clock signals input via the first and second input terminals, to amplify the differential reference clock signals, and to output the amplified differential reference clock signals via the first and second differential output terminals, the differential amplifier including a switching device connected between the first and second differential output terminals, the switching device having a control terminal adapted to receive an equalization control signal and in response thereto to equalize voltages on the first and second differential output terminals;

a first transmission circuit connected between the first differential output terminal of the differential amplifier and a first node, and adapted to transmit to the first node a first one of the amplified differential reference clock signals appearing at the first differential output terminal of the differential amplifier;

a second transmission circuit connected between the second differential output terminal of the differential amplifier and a second node, and adapted to transmit to the second node a second one of the amplified differential reference clock signals appearing at the second differential output terminal of the differential amplifier;

a first storage unit connected between the first node and a ground voltage, and adapted to store a signal of the first node;

a second storage unit connected between the second node and the ground voltage and adapted to store a signal of the second node; and a switching circuit connected between the first node and a first output terminal of the duty cycle correction circuit, and connected between the second node and a second output terminal of the duty cycle correction circuit, the switching circuit having a control terminal adapted to receive a switching control signal to selectively provide the signals of the first and second nodes to the first and second output terminals of the duty cycle correction circuit.

2. The duty cycle correction circuit of claim 1, wherein the switching circuit comprises:
   a third transmission circuit adapted to transmit the signal of the first node to the first output terminal when the switching control signal has a deactivated state;
   a fourth transmission circuit adapted to transmit the signal of the second node to the second output terminal when the switching control signal has the deactivated state;
   a first voltage supplying circuit which is connected between the first output terminal and the ground voltage, and supplies the ground voltage to the first output terminal when a switching control signal has an activated state; and
   a second voltage supplying circuit which is connected between the second output terminal and the ground voltage, and supplies the ground voltage to the second output terminal when the switching control signal has the activated state.

3. The duty cycle correction circuit of claim 2, wherein the first through fourth transmission circuits each include a PMOS transistor and a NMOS transistor.

4. The duty cycle correction circuit of claim 1, wherein the first and second storage units each include a MOS transistor.

5. A duty cycle correction circuit, comprising:
   a pair of input terminals adapted to receive a pair of differential reference clock signals each having a duty cycle;
   a differential amplifier adapted to amplify the differential reference clock signals and provide the differential reference clock signals to the integrating means, the differential amplifier including a switching device connected between first and second differential output terminals thereof, the switching device having a control terminal adapted to receive an equalization control signal and in response thereto to equalize voltages on the first and second differential output terminals;
   integrating means for integrating each of the reference clock signals to produce a pair of control signals indicating the duty cycles of the differential reference clock signals; and
   switching means adapted to receive a switching control signal and in response thereto to selectively output the control signals when the switching control signal has a first state and to output a pair of fixed voltage signals when the switching control signal has a second state.

6. The duty cycle correction circuit of claim 5, where the integrating means includes at least a pair of capacitors each for integrating a corresponding one of the reference clock signals.

7. The duty cycle correction circuit of claim 5, where the fixed voltage signals are ground voltages, and wherein the switching means includes a pair of transistors connected between corresponding output terminal and ground.

* * * * *